United States Patent [19]

Chamzas et al.

[11] Patent Number: 4,973,961
[45] Date of Patent: Nov. 27, 1990

[54] METHOD AND APPARATUS FOR CARRY-OVER CONTROL IN ARITHMETIC ENTROPY CODING

[75] Inventors: Christosdoulos Chamzas, West Long Branch; Donald L. Duttweiler, Rumson, both of N.J.

[73] Assignee: AT&T Bell Laboratories, Murray Hill, N.J.

[21] Appl. No.: 478,335

[22] Filed: Feb. 12, 1990

[51] Int. Cl.$^5$ .................................... H03M 7/26
[52] U.S. Cl. .................................... 341/51; 341/107; 341/86
[58] Field of Search ................... 341/51, 107, 86; 364/554; 358/261.2

[56] References Cited

U.S. PATENT DOCUMENTS

| | | | |
|---|---|---|---|
| 4,437,087 | 3/1984 | Petr | 341/51 |
| 4,463,342 | 7/1984 | Langdon et al. | 340/347 |
| 4,549,304 | 10/1985 | Weirich et al. | 341/51 X |

OTHER PUBLICATIONS

"A Multi-Purpose VLSI Chip for Adaptive Data Compression of Bilevel Images", *IBM Journal of Research and Development*, vol. 32, No. 6, Nov. 1988, pp. 775-795.

"Arithmetic Coding for Data Compression", *Communications of the ACM*, Jun. 1987, vol. 30, No. 6, pp. 520-540.

*Primary Examiner*—William M. Shoop, Jr.
*Assistant Examiner*—Sharon D. Logan
*Attorney, Agent, or Firm*—Thomas Stafford

[57] ABSTRACT

In order to employ an output register having a finite number of stages in an arithmetic encoder, it is necessary to provide carryover control, otherwise a register having an impractically large number of stages would be required, i.e., a so-called "infinite" register. The so-called "infinite" output register is emulated by employing a counter and a finite register. To this end, a count is accumulated of sets, i.e., bytes, of consecutive prescribed logical signals of a first kind, i.e., logical 1's, being generated by an arithmetic coding register and possibly modified by a carry indication. The accumulated count is then employed to supply as an output a like number of sets including logical signals of a second kind, i.e., logical 0's, or logical signals of the first kind, i.e., logical 1's, depending on whether or not a carry would propagate through the stages of the so-called "infinite" register being emulated.

17 Claims, 5 Drawing Sheets

FIG.3
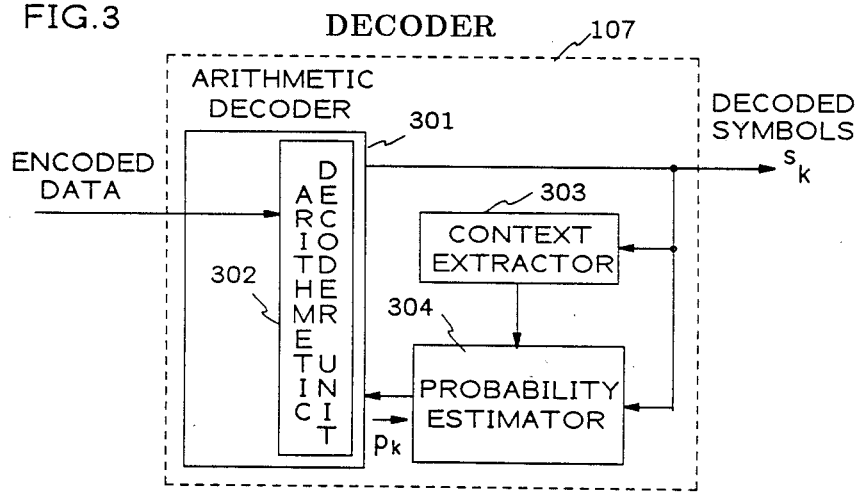
FIG.4 ARITHMETIC ENCODER 201
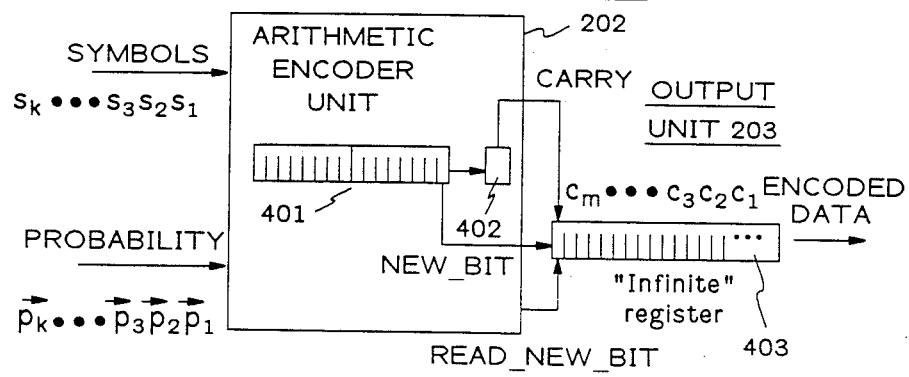

METHOD AND APPARATUS FOR CARRY-OVER CONTROL IN ARITHMETIC ENTROPY CODING

TECHNICAL FIELD

This invention relates to the control of carries in the encoding of signals and, more particularly, to the control of carries in arithmetic entropy encoding.

BACKGROUND OF THE INVENTION

Techniques are known in the art for providing carry-over control in combining high and low order binary number strings. Prior carry-over control techniques for use in, for example, arithmetic coding and decoding, are described in U.S. Pat. No. 4,463,342 issued July 31, 1984 and an article entitled "A Multi-Purpose VLSI Chip For Adaptive Data Compression of Bilevel Images", *IBM Journal of Research and Development*, Vol. 32, No. 6, Nov. 1988, pages 775-795. Another carry-over control technique is described in an article entitled "Arithmetic Coding for Data Compression", *Communications of the ACM*, June 1987, Volume 30, Number 6, pages 520-540.

Disadvantages of the techniques disclosed in the U.S. Pat. No. 4,463,342 and in the IBM Journal article, noted above, are that they incur a compression performance penalty in a transmitter/encoder and an increase in the complexity of a corresponding receiver/decoder. These disadvantages result because of the need to insert so-called control characters, i.e., bits, in the transmitter/encoder bit stream and the need to remove the control characters in the corresponding receiver/decoder.

The technique disclosed in the "Arithmetic Coding For Data Compression" article has the disadvantage of significantly increasing the computational complexity of the encoder/decoder. This increase in complexity results because per bit processing of information is required in the encoder and decoder.

SUMMARY OF THE INVENTION

Disadvantages and problems of prior carry-over control techniques for use in arithmetic entropy encoding are avoided, in accordance with the present invention, by maintaining a count of sets of consecutive prescribed logical signals provided as an output of an arithmetic encoder unit to emulate a register having an impractically large number of stages, i.e., a so-called "infinite" register. The count is employed to output a like number of sets of prescribed logical signals of a first kind or prescribed logical signals of a second kind depending on whether or not a carry would propagate through the stages of the so-called "infinite" register being emulated.

In one exemplary embodiment of the invention each set is a byte of bits and the prescribed logical signals of the first kind are logical 1's and the prescribed logical signals of a second kind are logical 0's.

BRIEF DESCRIPTION OF THE DRAWING

In the Drawing:

FIG. 3 shows details of a decoder unit which may be employed in the system of FIG. 1;

FIG. 4 illustrates in a conceptual form an encoder including a so-called "infinite" register in an output unit useful in describing the invention;

DETAILED DESCRIPTION

Figure 1:
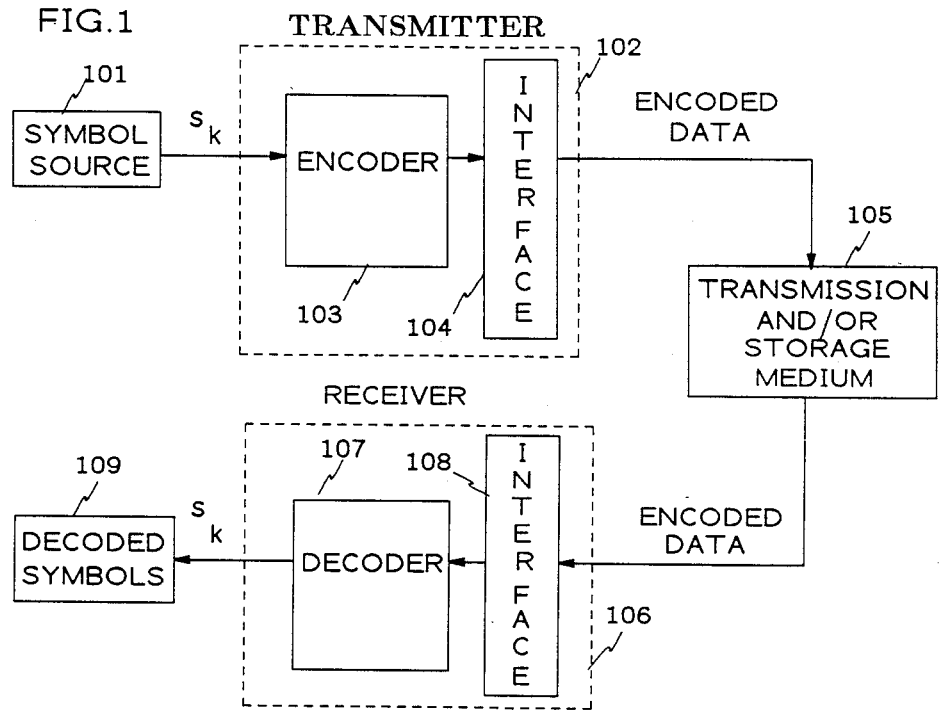
FIG. 1 shows details of a system arrangement in which the invention may be advantageously employed.

FIG. 1 shows, in simplified block diagram form, a system arrangement in which the invention can be advantageously employed. Accordingly, shown are symbol source 101, transmitter 102 including encoder 103 and interface unit 104, transmission and/or storage medium 105, receiver 106 including interface 108 and decoder 107 and decoded symbols unit 109.

Data symbols $s_k$ to be encoded are supplied from symbol source 101 to transmitter 102 and, therein, to encoder 103. Symbols $s_k$ can be obtained from any data source and may be, for example, data symbols representing an image. The number A of different values the symbols $s_k$ can take on, that is, the size of the symbol alphabet is unrestricted in general, but in many applications the alphabet is binary and A=2. Encoder 103, in this example, is an entropy arithmetic encoder which is employed to encode the data symbols in compressed form for transmission as encoded data via interface unit 104 to transmission and/or storage medium 105. The implementation of interface unit 104 is dependent on the medium being interfaced to, i.e., the particular transmission medium and/or the particular storage medium. Such interface units are well known in the art. Encoded data is supplied from transmission and/or storage medium 105 to receiver 106 and, therein, to interface unit 108 and decoder 107. The specific implementation of interface unit 108 must be compatible with either the transmission medium and/or the storage medium which is supplying the encoded data. It is noted, however, that encoded data may be transmitted via a transmission medium to a remote decoder and/or to some storage medium. Decoder 107, in this example, is also an entropy arithmetic decoder of a type which is compatible with encoder 103 and decodes the encoded data to obtain a decoded version of the original symbols $s_k$ supplied from symbol source 101. The decoded symbols $s_k$ are supplied to decoded symbols unit 109 for use as desired. One use, for example, is to define an image.

Figure 2:
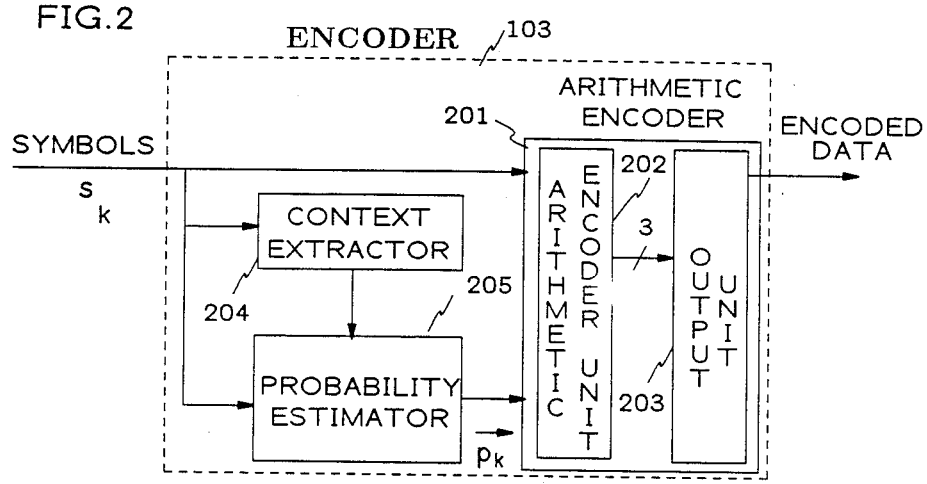
FIG. 2 depicts details of an encoder unit, including aspects of the invention, that may be employed in the system of FIG. 1.

FIG. 2 depicts, in simplified block diagram form, details of encoder 103. Accordingly, shown are arithmetic encoder 201 including arithmetic encoder unit 202 and output unit 203, context extractor 204 and probability estimator 205. Symbols $s_k$ to be encoded along with a probability estimates $p_k$ for the symbols being encoded are supplied to arithmetic encoder 201 and, therein, to arithmetic encoder unit 202. Arithmetic encoder unit 202 in conjunction with output unit 203 encodes the supplied symbols, in accordance with the invention, to yield the desired encoded data. Probability estimator 205 is responsive to the supplied symbols $s_k$ and an obtained context from context extractor 204 to generate the desired probability estimate. Context extractor 204 generates the context in known manner. It is noted, however, that a context can be fixed and supplied as desired. The generated probability estimate is $p_k = (p_1 p_2 p_3 \ldots p_A)$ for incoming symbol $s_k$ and its associated context. Arithmetic encoder units, context extractors and probability estimators are known in the art and such known units, as desired, may be employed for arithmetic encoder unit 202, context extractor 204 and probability estimator 205. For known arithmetic encoder units see, for example, the U.S. Pat. No. 4,463,342 and IBM Journal article, noted above. Any appropriate context extractor or probability estimator may be employed in encoder 103. Preferably, a probability estimator is employed such as the one disclosed in co-pending U.S. patent application Ser. No. 359,559, filed June 1, 1989. Similarly, it is preferred that an adaptive context extractor is used such as the one disclosed in co-pending U.S. patent application Ser. No. 386,537, filed July 28, 1989. Output unit 203 is responsive to prescribed signals being output from arithmetic encoder unit 202 and emulates a so-called "infinite" register, in accordance with the invention. Further details of arithmetic encoder unit 202 and output unit 203 and their operation are described below.

FIG. 3 shows, in simplified block diagram form, details of decoder 107. Accordingly, shown are decoder 301 including arithmetic decoder unit 302, context extractor 303 and probability estimator 304. Again, such arithmetic decoder units are known in the art. Arithmetic decoder unit 302, however, must be compatible with arithmetic encoder unit 202. Similarly, context extractor 303 and probability estimator 304 are identical to context extractor 204 and probability estimator 205, respectively. Decoder 107 and arithmetic decoder unit 301 therein are supplied with the encoded data and a probability estimate from probability estimator 304 to generate decoded versions of the orginal symbols $s_k$. Again, the probability estimate is generated for a given context obtained via context extractor 303. It is important to note that an advantage of out unique encoding invention is that decoder 107, and hence, arithmetic decoder 301 need not include any special processing apparatus, as was required by prior decoders employed, to process control characters or the like used in carry-over control. Consequently, the complexity of decoder unit 301 and, hence, decoder 107 is reduced as compared to prior arrangements.

FIG. 4 illustrates, in simplified form, a conceptualized form of an entropy encoder including output unit 203 comprised of "infinite" register 403. To this end, shown are arithmetic encoder unit 202 and output unit 203 of encoder 103. Arithmetic encoder unit 202 is supplied with and is responsive to symbols $s_k$ and corresponding probability estimates $p_k$ for arithmetically encoding the symbols in known fashion. It is also noted that symbol $s_k$ and the corresponding probability estimate $p_k$ are supplied in a first-in first-out (FIFO) fashion. It is noted that for brevity and clarity of description only arithmetic coding register 401 and its CARRY stage 402 of arithmetic encoder unit 202 are shown in FIG. 4. Again, see for example, the U.S. Pat. No. 4,463,342 patent and the IBM Journal article, noted above, for such arithmetic encoder units. To this end, arithmetic encoder unit 202 generates a CARRY indicative of the carry state of CARRY stage 402, i.e., a first CARRY indication, a NEW_BIT indicative of a bit to be output, i.e., read from arithmetic coding register 401 and READ _NEW_BIT indicative that the NEW_BIT is ready to be read from arithmetic coding register 401 of arithmetic encoder unit 202. CARRY, NEW_BIT and READ_NEW_BIT are supplied to so-called "infinite" register 403 of output unit 203. Again, "infinite" register 403 conceptualized in output unit 203 of FIG. 4, is one that has an impractically large number of stages to effectively implement. Operation of "infinite" register 403 of output unit 203 is to add CARRY to the logical signal in stage 1, shift it and, then, put NEW_BIT into stage 1.

Our invention relies on the fact that the data output $\{c_1,c_2,c_3, \ldots ,c_m\}$ present in "infinite" register 403, the inputs to arithmetic encoder unit 202 of symbols $\{s_1,s_2,s_3, \ldots ,s_k\}$ and the corresponding probability estimates $\{p_1,p_2,p_3, \ldots ,p_k\}$, satisfy the so-called "decodability property". This property is briefly outlined below and more thoroughly described in the U.S. Pat. No. 4,463,342, noted above.

Let (S,P) represent a set of input symbols and corresponding probability estimates, namely, the concatenations $\{s_1,s_2,s_3, \ldots s_k\}$, $\{p_1,p_2,p_3, \ldots ,p_k\}$ and let C(S,P) represent the corresponding binary data output $\{c_1,c_2,c_3, \ldots ,c_m\}$ present in the "infinite" register interpreted as a binary fraction, i.e., $$C(S,P) = C(s_1 s_2 s_3 \ldots s_k, p_1 p_2 p_3 \ldots p_k) = .c_1 c_2 c_3 \ldots c_m \quad (1)$$

Also, let L(C(S,P)) represent the length of $\{c_1,c_2,c_3, \ldots ,c_m\}$ as follows:

$$L(C(S,P)) = \text{length of } \{c_1,c_2,c_3, \ldots ,c_m\} = m \quad (2)$$

Additionally, let (S',P) denote any continuation string of (S,P), let S S' denote the strings S and S' concatenated and let PP' denote the corresponding strings P and P'vec concatenated. Then, $$C(SS',PP') = C(S,P) + 2^{-L(C(S,P))} C(S',P) < C(S,P) + 2^{-m} \quad (3)$$

is valid and is defined as the "decodability" property of an arithmetic encoder.

An important consequence of the decodability property (equation (3)), is that any bit which has been generated by arithmetic encoder unit 202 can experience at most one (1) carry in. This also means that once a logical 0 has been generated in arithmetic encoder unit 202, prior bits which have been generated will not experience a carry in, i.e., the state of the prior generated bits cannot be changed by a carry in occurring after the generation of the logical 0. Thus, these generated bits can now be supplied to transmission and/or storage medium 105 (FIG. 1). However, it is noted that "infinite" register 403 of output unit 203 (FIG. 4) must be "long" enough, i.e., have a sufficient number of stages, to store any possible sequence of consecutive logical 1's. This number of stages would be impractically large to implement.

Thus, a significant problem with the conceptualized implementation of FIG. 4 is that any such implementation of so-called "infinite" register 403 requires an impractical number of stages and is effectively unrealizable.

Figure 5:
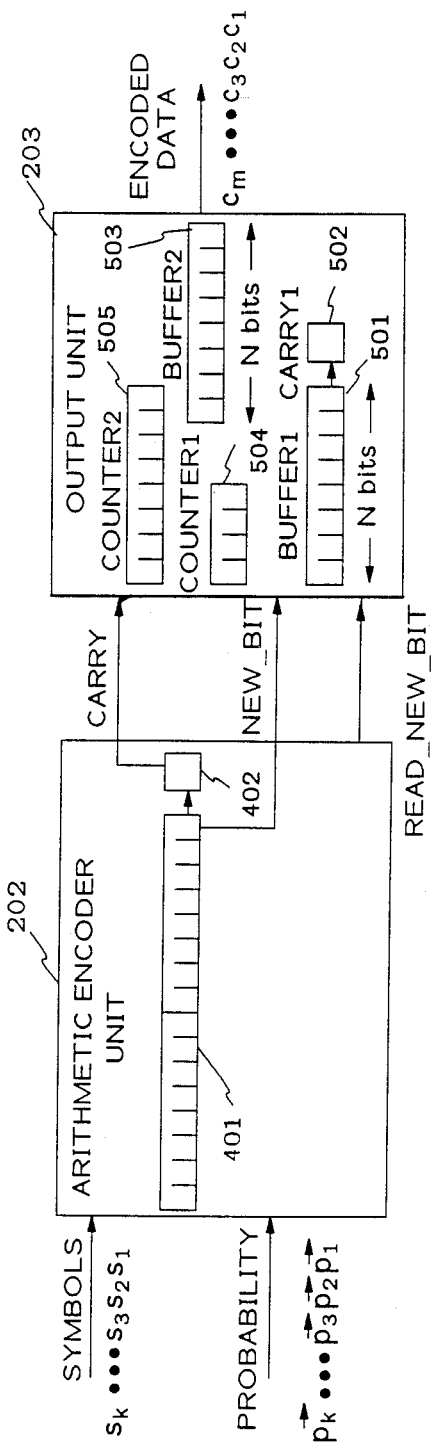
FIG. 5 depicts, in simplified form, aspects of the invention in the arithmetic encoder unit and output unit of the encoder of FIG. 2.

FIG. 5 shows, in simplified form, details of arithmetic encoder unit 202 and output unit 203, including an embodiment of the invention, in which the need for an impractically large register is avoided. As indicated above, arithmetic encoder unit 202 includes arithmetic coding register 401 and CARRY stage 402 and generates CARRY, NEW_BIT and READ_NEW_BIT which are supplied to output unit 203. Output unit 203 includes a first buffer memory 501 (BUFFER1) including N stages for storing a set of logical signals, where $N \geq 1$ and in this example $N=8$, i.e., a byte. Also included in output unit 203 is a carry-over stage 502 (CARRY1) for storing a second CARRY indication of whether or not a carry-over was generated for the bits stored in buffer 501. In this example, a logical 1 indicates a carry and a logical 0 indicates no carry. Second buffer memory 503 (BUFFER2) also including N stages is employed to output the encoded data, namely, $\{c_1 c_2 c_3 \ldots c_m\}$. Counter 504 (COUNTER1) is employed to count the number of bits in buffer 501. Counter 505 (COUNTER2) is employed, in accordance with an aspect of the invention, to maintain a count of sets of consecutive logical signals of a first kind, e.g., logical 1's, which have been supplied into buffer 501. In this example, counter 505 indicates the number of sets of prescribed logical signals to be output after buffer 503. The count in counter 505 is then advantageously employed, in accordance with the invention, to output after buffer 503 a like number of sets including either the prescribed logical signals of the first kind, e.g., logical 1's, or the prescribed logical signals of the second kind, e.g., a logical 0's, depending on whether or not CARRY1 in stage 502 indicates no carry, e.g., a logical 0 or carry, i.e., a logical 1, respectively. In this manner, and in accordance with the invention, output unit 203 emulates the so-called "infinite" register.

It should be noted that for clarity and brevity of description buffer memory 501 (BUFFER1) (FIG.5) is shown and described as a unit separate from arithmetic encoder unit 202. However, it will be apparent to those skilled in the art that BUFFER1 and CARRY1 typically can be or are merged with the arithmetic coding register 401 of arithmetic encoder unit 202. Then, the CARRY stage 402 shown in arithmetic encoder unit 202 (FIG. 5) is also merged into the arithmetic coding register 401 (see for example the IBM Journal article noted above)

Figure 6:
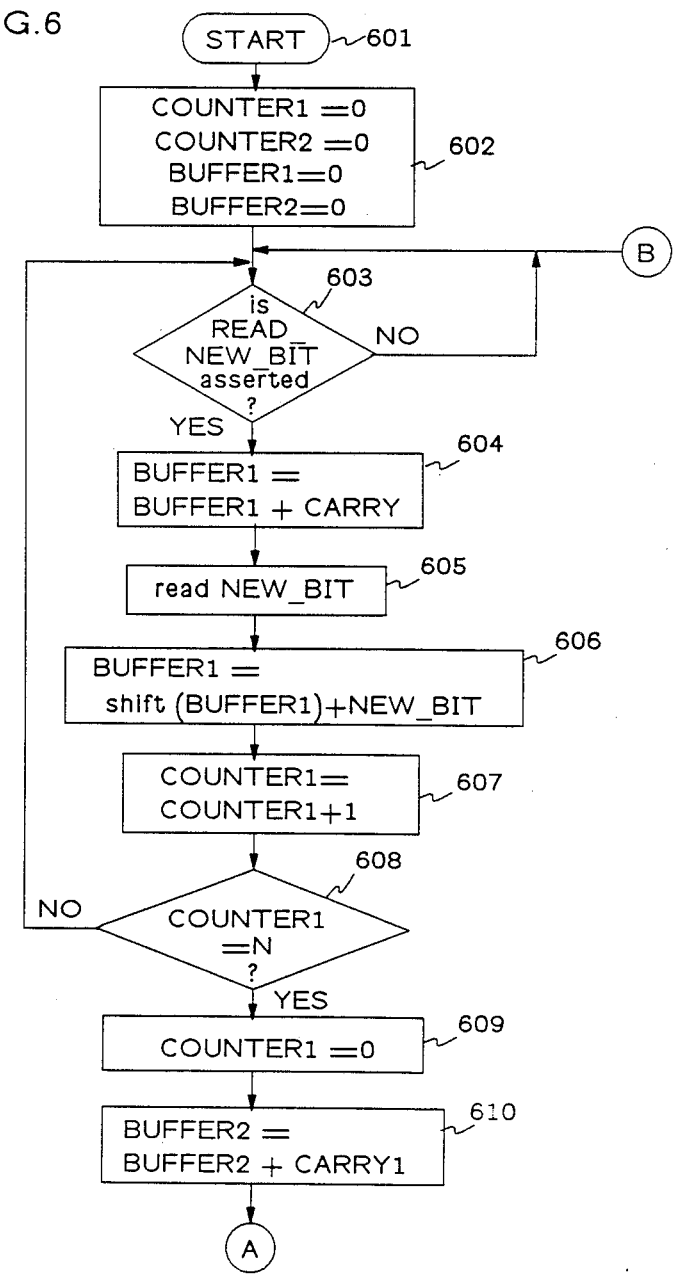
FIG. 6 and FIG. 7, when connected A—A and B—B, form a flow chart of a sequence of steps in the operation of the embodiment of the invention shown in FIG. 5.
Figure 7:
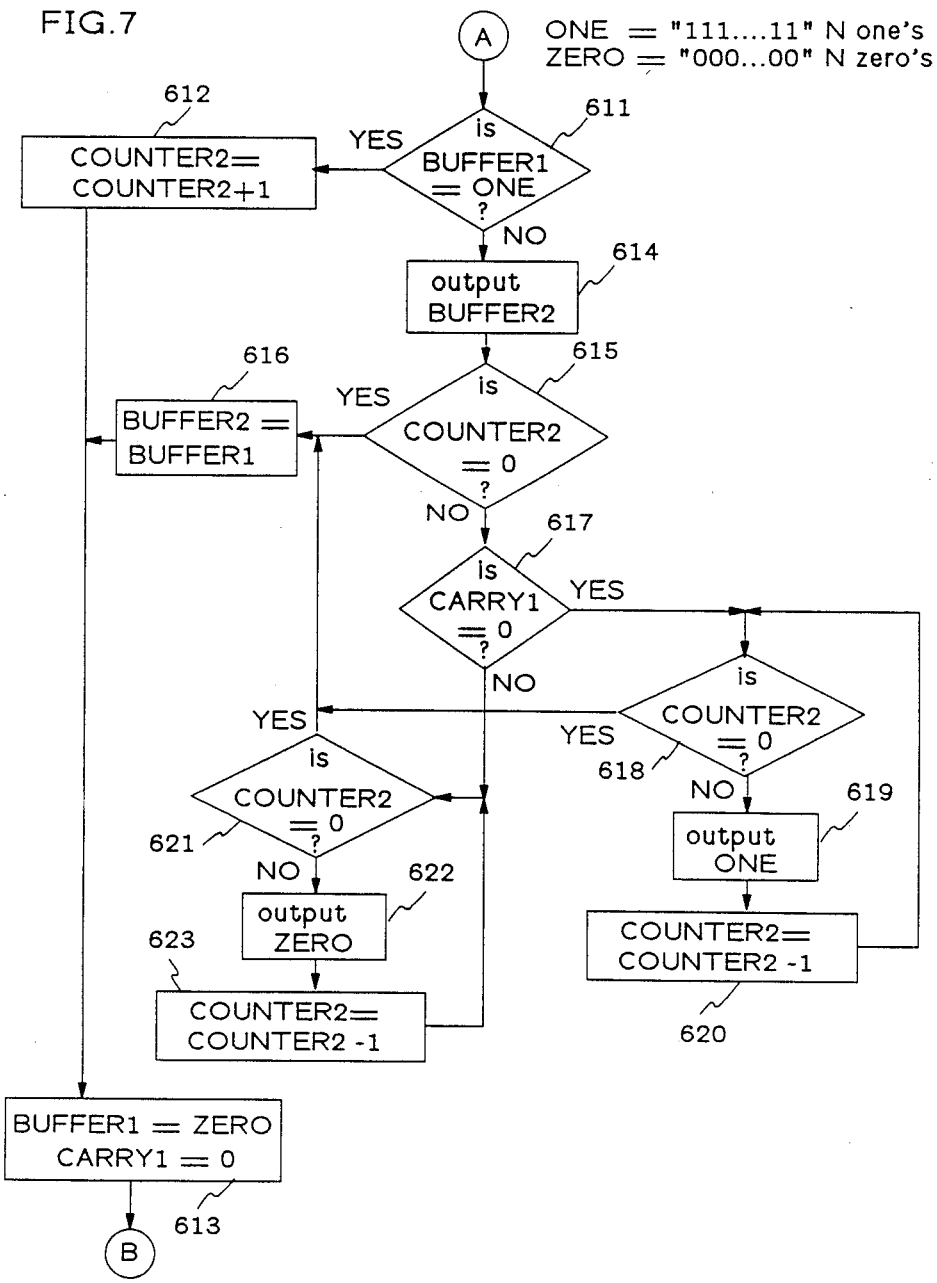

Operation of output unit 203 of FIG. 5, in accordance with the invention, is best explained by referring to the sequence of steps shown in the flow chart formed when connecting FIG. 6 and FIG. 7 A—A and B—B. These steps are indicative of the operations effected by either a software or hardware implementation of the invention. Accordingly, the sequence is entered via start step 601. Thereafter, operational block 602 initializes the stages of COUNTER1 (504), COUNTER2 (505), BUFFER1 (501) and BUFFER2 (503) to logical 0's. Conditional branch point 603 tests to determine if READ_NEW_BIT from arithmetic encoder unit 202 (FIG. 5) has been asserted, e.g., is a logical 1. If the test result is NO, step 603 is iterated. If the test result in step 603 is YES, operational block 604 causes the CARRY from CARRY stage 402 of arithmetic encoder unit 202 to be added to the bit in the first stage of BUFFER1 i.e., BUFFER1=BUFFER+CARRY. Then, operational block 605 causes the NEW_BIT to be read from the output register of arithmetic encoder unit 202 and operational block 606 shifts the bits in BUFFER1, i.e., BUFFER1=shift(BUFFER1)+NEW_BIT. Operational block 607 causes COUNTER1 to be incremented, i.e., COUNTER1=COUNTER1+1. Conditional branch point 608 tests to determine if the bit-fill in COUNTER1 is equal to N, where $N \geq 1$ and in this example $N=8$. If the test result is NO, control is returned to step 603 and steps 603 through 608 are iterated until step 608 yields a YES result. This YES result indicates that BUFFER1 is filled. Operational block 609 then resets COUNTER1=0 and operational block 610 sets BUFFER2 to BUFFER2=BUFFER2+CARRY1, i.e., the carry from CARRY1 is added to BUFFER2. Conditional branch point 611 tests to determine if BUFFER1 is ONE, i.e., contains all logical 1's in its N stages. If the test result is YES, all logical 1's are in the stages of BUFFER1 and operational block 612 causes COUNTER2 to be incremented, i.e., COUNTER2=COUNTER2+1. Then, operational block 613 sets BUFFER1=ZERO, i.e., all logical 0's in its N stages and sets CARRY1=0. Thereafter, control is returned to step 603. If the test result in step 611 is NO, the content of BUFFER1 is other than all logical 1's and operational block 614 causes the bit content of BUFFER2 to be supplied as an output. Then, conditional branch point 615 tests to determine if COUNTER2=0. If the test result is YES, operational block 616 sets the content of BUFFER2 to be that of BUFFER1, i.e., BUFFER2=BUFFER1. Thereafter, step 613 is iterated and control is returned to step 603. If the test result in step 615 is NO, there is at least one group, in this example, a byte, of the prescribed logical signals of the first kind or the prescribed logical signals of the second kind to be supplied as an output from BUFFER2. Conditional branch point 617 tests to determine if CARRY1 is a logical 0. If the test result is YES, there is no carry, i.e., a logical 0 in CARRY1 and sets of logical 1's are to be supplied as and output. Then, conditional branch point 618 tests to determine if COUNTER2 is zero (0), i.e., determines if there are any sets of logical signals to be supplied as an output. If the test result is NO, operational block 619 causes a set of logical 1's, i.e., a ONE to be supplied as an output via BUFFER2. Operational block 620 decrements COUNTER2, i.e., COUNTER2=COUNTER2-1 and control is returned to step 618. Steps 618-620 are iterated until COUNTER2 is zero (0) and there are no more sets of the prescribed logical signals of the first kind, i.e., logical 1's, to be supplied as an output via BUFFER2. When the test result in step 618 is YES, steps 616 and 613 are repeated and control is returned to step 603. If the test result in step 617 is NO, there is a carry, i.e., a logical 1, in CARRY1 which would cause all logical 1's to be logical 0's. Conditional branch point 621 tests to determine if COUNTER2 is zero (0). If the test result is NO, operational block 622 causes a set of logical 0's, i.e., a ZERO, to be supplied as an output via BUFFER2. Operational block 623 decrements COUNTER2, i.e., COUNTER2=COUNTER2-1 and control is returned to step 621. Steps 621-623 are iterated until COUNTER2 is zero (0) and there are no more sets of the prescribed logical signals of the second kind, i.e., logical 0's, to be supplied as an output from BUFFER2. When the test result in step 621 is YES, steps 616 and 613 are repeated and control is returned to step 603. Note that if CARRY1 is a logical 1 it ripples through all the consecutive sets of prescribed logical signals of the first kind and sets of prescribed signals of the second kind are supplied as an output. If CARRY1 is logical 0, sets of the prescribed logical signals of the first kind are supplied as an output. Thus, in this example, sets of logical 0's are supplied as an output when CARRY1 is a logical 1 and sets of logical 0's are supplied as an output when CARRY1 is a logical 0. That is to say, the prescribed logical signals in the sets being supplied as an output are complementary to the CARRY1 indication. Therefore, in this unique manner the so-called "infinite" register is emulated, in accordance with the invention.

We claim:

1. Apparatus for adaptively encoding an input signal having a plurality of symbol values comprising,
a source of an input signal to be encoded,
means for supplying a probability estimate of said input signal,
arithmetic encoder means supplied with said input signal and said probability estimate for generating an encoded version of said input signal, said arithmetic encoder means including an arithmetic coding register for generating a compressed data version of said input signal and a first carry indication and an output processing unit,
means for supplying said encoded version of said input signal to a transmission and/or storage medium,
said arithmetic encoder output processing unit being characterized by
means supplied with said compressed data version and being responsive to said first carry indication for accumulating a count of sets of consecutive prescribed logical signals of a first kind being supplied from said arithmetic coding register,
means for obtaining a second carry indication representative of whether a first carry would propagate through said logical signals of said sets being counted,
means for storing and supplying as an output any sets of logical signals obtained from said arithmetic coding register generated prior to and after accumulating said count of sets,
means for adding said second carry indication to said means for storing and supplying, and
means for supplying as an output a number of sets equal to said accumulated count including prescribed logical signals of the first kind or prescribed logical signals of a second kind dependent on said second carry indication.

2. The apparatus as defined in claim 1 wherein said prescribed logical signals of said first kind are logical 1's and said prescribed logical signals of said second kind are logical 0's.

3. The apparatus as defined in claim 1 wherein said means for supplying as an output includes means for supplying as an output a number of sets equal to said count, each set including prescribed logical signals complementary to said second carry indication.

4. The apparatus as defined in claim 3 wherein said second carry indication being a logical 1 indicates a carry and said second carry indication being a logical 0 indicates no carry.

5. The apparatus as defined in claim 1 wherein said means for accumulating a count includes first buffer means having a predetermined number of stages for storing bits of said supplied compressed data version, said first carry indication being added to a first stage of said first buffer means and said bits of said bits of said compressed data version being shifted into said stages and counter means for obtaining a count of sets of consecutive logical signals of the first kind in said first buffer means.

6. The apparatus as defined in claim 5 wherein said predetermined number of stages is equal to a number of bits in each of said sets.

7. The apparatus as defined in claim 6 wherein said means for storing and supplying includes second buffer means having a predetermined number of stages, sets of bits not including all logical signals of said first kind from said first buffer means being supplied to and stored in said second buffer means, and wherein said second carry indication is added to a first stage of said second buffer means.

8. The apparatus as defined in claim 7 wherein said means for supplying as an output which includes means for supplying said number of sets equal to said count through said second buffer means.

9. The apparatus as defined in claim 8 wherein said prescribed logical signals of said first kind are logical 1's and said prescribed logical signals of said second kind are logical 0's.

10. The apparatus as defined in claim 9 wherein said number of stages in said first and second buffer means is the same and is equal to a number of bits in a set.

11. The apparatus as defined in claim 10 wherein each of said sets includes a byte of bits.

12. A method for adaptively encoding an input signal having a plurality of symbol values comprising the steps of,
supplying an input signal to be encoded from a signal source,
supplying a probability estimate of said input signal,
arithmetic encoding said supplied input signal in response to said probability estimate to generate an encoded version including generating a compressed data version of said input signal and a first carry indication and processing said compressed data version in response to said first carry indication, and
supplying said encoded version of said input signal to a transmission and/or storage medium,
said step of processing being characterized by
accumulating a count of sets of consecutive prescribed logical signals of a first kind in said compressed data version modified by said first carry indication,
obtaining a second carry indication representative of whether a first carry would propagate through said prescribed logical signals of the first kind in said sets being counted,
storing and supplying as an output any sets of compressed data logical signals modified by said first carry indication prior to and after accumulating said count of sets,
adding said second carry indication to said sets generated prior to and after accumulating said counts of sets, and
supplying as an output a number of sets equal to said accumulated count, each set including prescribed logical signals of the first kind or prescribed logical signals of a second kind dependent on said second carry indication.

13. The method as defined in claim 12 wherein said prescribed logical signals of the first kind are logical 1's and said prescribed logical signals of the second kind are logical 0's.

14. The method as defined in claim 13 wherein said step of supplying as an output includes supplying as an output a number of sets equal to said count wherein each set includes prescribed logical signals complementary to said second carry indication.

15. The method as defined in claim 14 wherein said second carry indication being a logical 1 indicates a carry and said second carry indication being a logical 0 indicates no carry.

16. The method as defined in claim 15 wherein each of said sets includes a predetermined number of bits.

17. The method as defined in claim 16 wherein said predetermined number of bits is a byte.

* * * * *

UNITED STATES PATENT AND TRADEMARK OFFICE
CERTIFICATE OF CORRECTION

PATENT NO.   : 4,973,961

DATED        : November 27, 1990

INVENTOR(S)  : Christosdoulos Chamzas and Donald L. Duttweiler

It is certified that error appears in the above-identified patent and that said Letters Patent is hereby corrected as shown below: ON TITLE PAGE:    Inventors should read;

[75]  Inventors: Christodoulos Chamzas, West Long Branch;
                 Donald L. Duttweiler, Rumson, both of N.J.

Signed and Sealed this

Seventh Day of July, 1992

Attest:

DOUGLAS B. COMER

*Attesting Officer*    Acting Commissioner of Patents and Trademarks